United States Patent [19]
Chevallier et al.

[11] Patent Number: 5,313,429
[45] Date of Patent: May 17, 1994

[54] MEMORY CIRCUIT WITH PUMPED VOLTAGE FOR ERASE AND PROGRAM OPERATIONS

[75] Inventors: Christophe J. Chevallier, Mountain View; Asim A. Bajwa, San Jose; Darrell D. Rinerson, Cupertino; Steve K. Hsia, Saratoga, all of Calif.

[73] Assignee: Catalyst Semiconductor, Inc., Santa Clara, Calif.

[21] Appl. No.: 837,303

[22] Filed: Feb. 14, 1992

[51] Int. Cl.⁵ .............................. G11C 16/02
[52] U.S. Cl. .................... 365/226; 365/218; 365/189.01; 365/900
[58] Field of Search .............. 365/218, 226, 189.01, 365/900; 307/449, 402, 403, 404, 405

[56] References Cited

U.S. PATENT DOCUMENTS

| | | | |
|---|---|---|---|
| 4,638,464 | 1/1987 | Cranford, Jr. et al. | 365/226 |
| 4,667,312 | 5/1987 | Doung et al. | 365/189.01 |
| 5,034,926 | 7/1991 | Taura et al. | 365/185 |
| 5,216,588 | 6/1993 | Bajwa et al. | 363/60 |

Primary Examiner—Eugene R. LaRoche
Assistant Examiner—Andrew Tran
Attorney, Agent, or Firm—Skjerven, Morrill, MacPherson, Franklin & Friel

[57] ABSTRACT

A memory device is disclosed that employs hot electron injection for programming operations and Fowler-Nordheim tunneling for erase operations. The memory device requires only a single 5 volt power supply and does not require an external high voltage supply for program or erase operations. The memory device includes a charge pump section that internally generates the high voltage required for programming and erase operations. The same charge pump section is used for both program and erase power requirements.

24 Claims, 6 Drawing Sheets

MEMORY CIRCUIT WITH PUMPED VOLTAGE FOR ERASE AND PROGRAM OPERATIONS

BACKGROUND OF THE INVENTION

1. Field of the Invention

This invention relates to memory circuits and more particularly to erase and programming operations of flash memory and EPROM circuits.

2. Description of the Relevant Art

It is well known in flash memory technology that the size of a memory cell can be reduced if hot electron injection is employed for programming operations and if Fowler-Nordheim tunneling is employed for erase operations. To employ hot electron injection for programming, an external high voltage supply "Vpp", which is typically 12 volts, is required. Programming from the read supply voltage "Vcc", which is typically five volts, is ordinarily not possible since the read supply voltage level is insufficient to induce hot electron injection. Therefore, in these memory devices, two separate external power supplies, Vpp and Vcc, must be provided to the circuit.

During programming of the flash memory device, the gate junction of a memory cell transistor is driven by a voltage of approximately 12 volts. Due to the high impedance at the gate terminal, only a small current is required to charge the gate in the required time, typically less than 100 μA. On the other hand, the drain junction of the memory cell transistor is driven by a voltage of approximately six volts. A relatively high current of typically 1 mA per cell must be provided to the drain junction. Therefore, approximately 8 mA is required for a standard byte architecture during programming.

During erase operations, Fowler-Nordheim tunneling can be employed. Typically for a flash memory device, a large number of cells are erased simultaneously. This involves putting a high voltage of approximately 12 volts on the source junctions of the memory cells. Each cell may be leaking at this voltage approximately 10 nA, depending upon the exact process and temperature (source junction breakdown voltage). Thus, approximately 2.5 mA of current flows for a 256K byte chip and approximately 10 mA of current flows for a 1 megabyte device.

Approaches for eliminating the requirement of two separate power supplies (Vpp and Vcc) in such flash memory devices have been proposed. One approach has been to scale the memory transistor dimensions, and particularly L effective, to reduce the drain voltage necessary for programming. This approach, which must demonstrate sufficient programming efficiency at the lower limit of the Vcc specified range, has been unreliable so far.

SUMMARY OF THE INVENTION

In accordance with the present invention, a memory device is provided that employs hot electron injection for programming operations and Fowler-Nordheim tunneling for erase operations. The memory device requires only a single 5 volt power supply and does not require an external high voltage supply for program or erase operations. The memory device includes a charge pump section that internally generates the high voltage required for programming and erase operations. The same charge pump section is used for both program and erase power requirements.

These and other advantages are achieved with the present invention, in accordance with which a memory device comprises a memory cell matrix including a plurality of memory locations, an input power supply terminal for providing power to the memory device, an erase decoder coupled to the memory cell matrix for erasing selected ones of the plurality of memory locations, and a charge pump circuit coupled to the input power supply terminal and to the erase decoder for converting a voltage signal provided at the input power supply terminal to a high voltage signal and for providing the high voltage signal to the erase decoder.

In accordance with another aspect of the invention, a memory device comprises a memory cell matrix including a plurality of memory locations, an input power supply terminal for providing power to the memory device, a program decoder coupled to the memory cell matrix for programming selected ones of the plurality of memory locations, and a charge pump circuit coupled to the input power supply terminal and to the program decoder for converting a voltage signal provided at the input power supply terminal to a high voltage signal and for providing the high voltage signal to the program decoder.

A high current charge pump circuit incorporated within the memory device may comprise a first voltage pump unit including at least a first capacitive element coupled to a voltage output line that is charged in response to a first clocking signal, and a second voltage pump unit including at least a second capacitive element coupled to the voltage output line that is charged in response to a second clocking signal having an unequal phase relative to the first clocking signal.

The invention will be more readily understood with reference to the drawings and the detailed description. As will be appreciated by one skilled in the art, the invention is applicable to other memory circuits and is not limited to the specific embodiment disclosed.

DETAILED DESCRIPTION

The following includes a detailed description of the best presently contemplated mode for carrying out the invention. The description is intended to be merely illustrative of the invention and should not be taken in a limiting sense.

Figure 1:
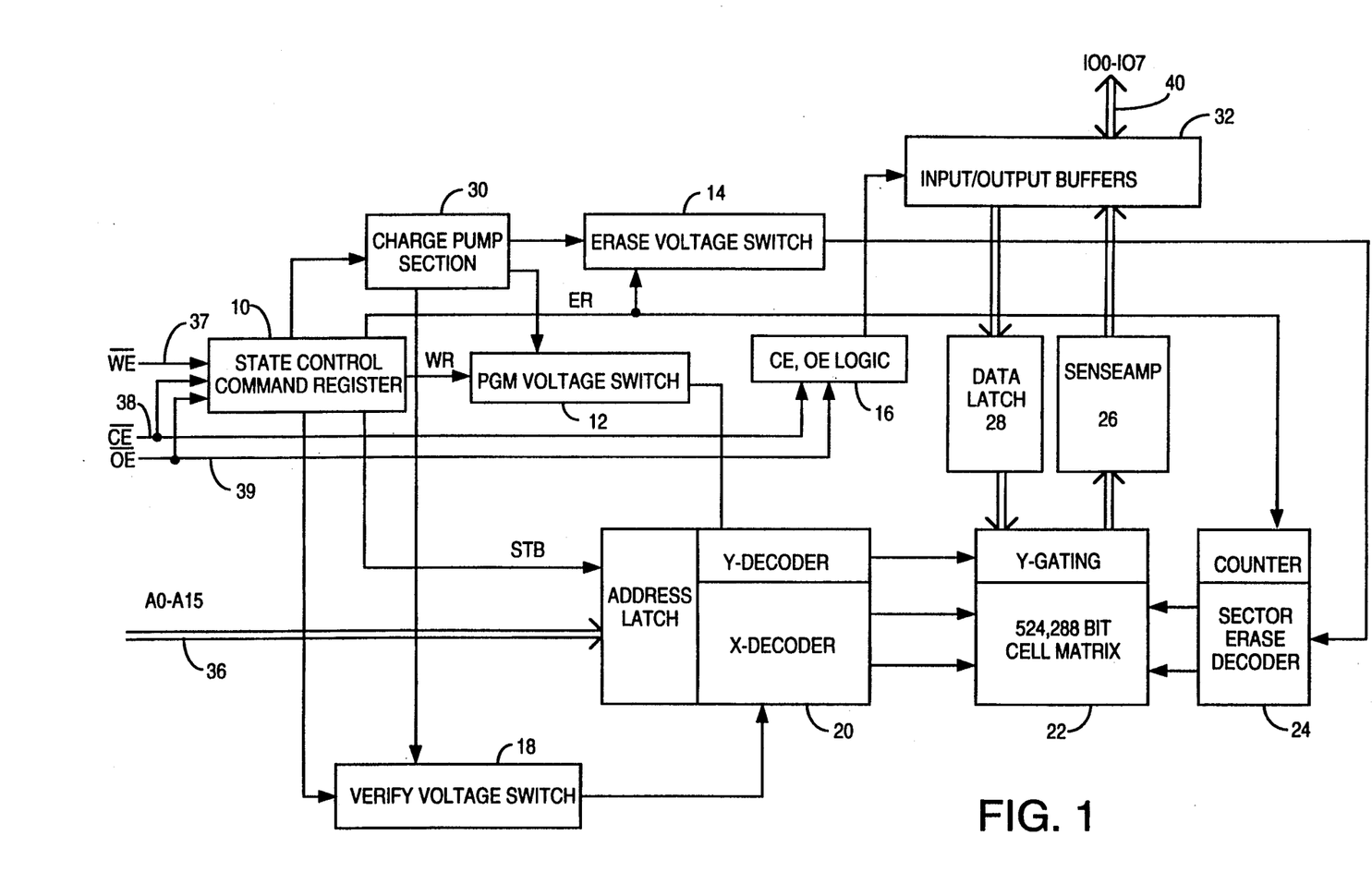
FIG. 1 is a block diagram illustrating a flash memory circuit in accordance with the present invention.

A flash memory circuit with pumped voltage for erase and write operations in accordance with the present invention is next explained in conjunction with FIGS. 1-6. Referring first to FIG. 1, a block diagram of the flash memory circuit is shown that includes a state control command register block 10, a program voltage switch 12, an erase voltage switch 14, chip enable and output enable logic block 16, and a verify voltage switch 18. The circuit further includes blocks 20, 22 and 24, a sense amplifier 26, and a data latch 28. Block 20 includes X and Y decoders and an address latch, block 22 includes a 512K byte cell matrix with Y-gating circuitry, and block 24 includes a sector erase decoder and a counter. The memory circuit finally includes a charge pump section 30 and an input/output buffer block 32.

The cell matrix block 22 is implemented using a standard memory matrix configuration as is well known in the art. Similarly, the decoding circuitry of blocks 20 and 24 as well as sense amplifier 26, data latch 28, and input/output buffer block 32 are each implemented in standard configurations. It will be appreciated by one skilled in the art that the size of the memory matrix as well as the particular implementation of the associated circuitry blocks may be varied without departing from the scope of the invention.

During operation of the flash memory circuit, appropriate signals from a computer system (not shown), are received at address bus 36, at lines 37–39 and at data bus 40. When the system requires access to one of the locations within the cell matrix of block 22, it sends an address on the address bus 36. This address is then decoded to allow access to the corresponding location of the cell matrix. Depending upon whether the access is a read or a write operation, data is either provided from the cell matrix to the sense amplifier 26 or to the cell matrix from the data latch 28. The sense amplifier 26 and the data latch 28 are connected to input/output buffer block 32 to allow the data to be provided to or from an external data bus 40.

It is noted that the embodiment of FIG. 1 includes a sector erase decoder that allows the erase of selected cell groups. The invention may also be applied to systems employing bulk erase.

In accordance with the invention, the command register 10 decodes write and erase command signals from a system and triggers the charge pump section 30 which correspondingly generates the voltage supply levels that are switched to one of the decoders within blocks 20 and 24. The charge pump section 30 is powered from the 5 volt read supply voltage Vcc. Since the charge pump section 30 generates the required voltage levels required for both program and erase operations, an external high voltage supply is not required.

Figure 2:
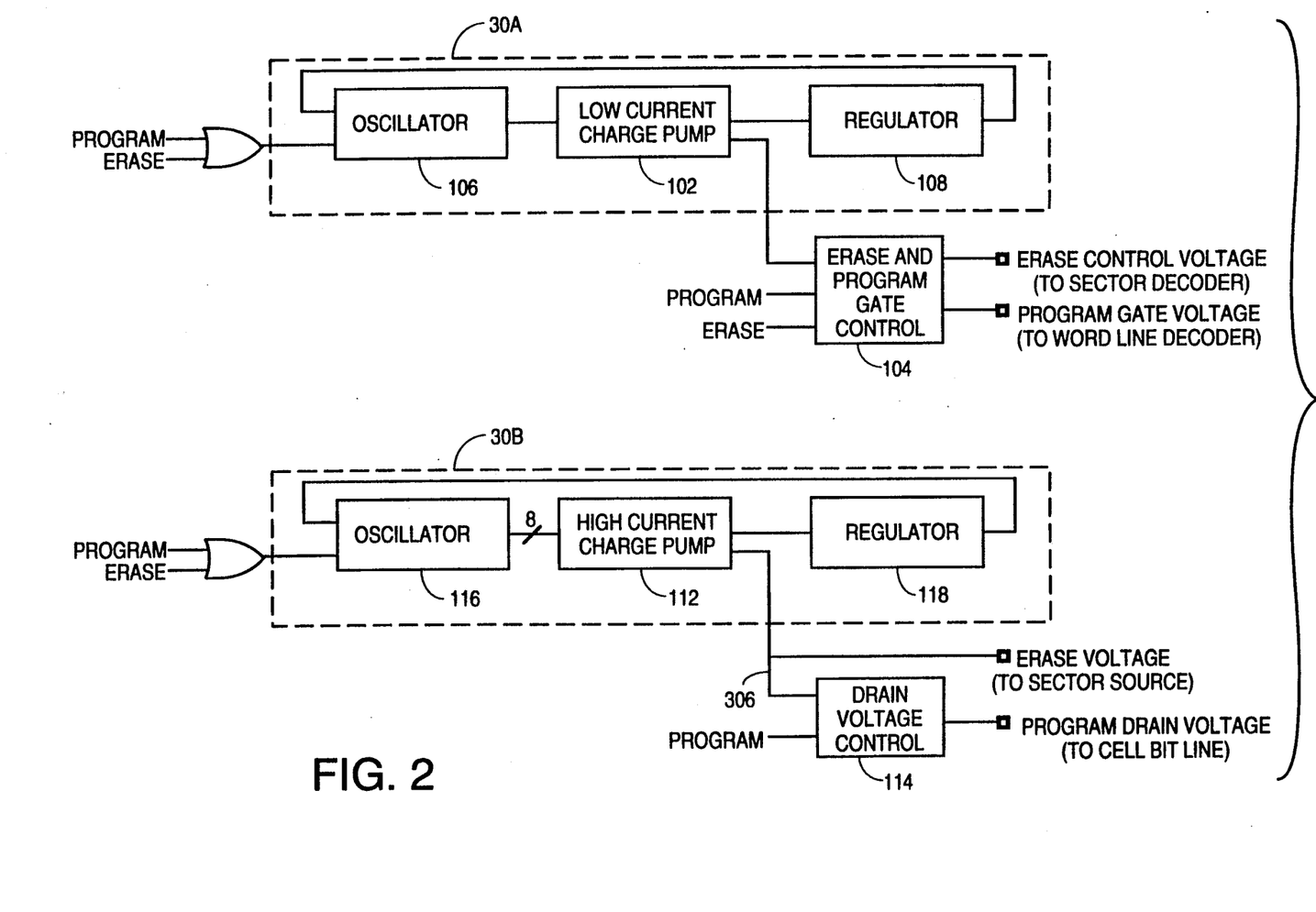
FIG. 2 is a block diagram illustrating the voltage pumps and the high voltage switching sections of the flash memory circuit.

The charge pump section 30, the program voltage switch 12 and the erase voltage switch 14 are next considered with reference to FIG. 2. The charge pump section 30 of FIG. 1 includes two separate power converter units 30A and 30B. Power converter unit 30A includes an oscillator 106, a low current charge pump circuit 102, and a regulator 108. Power converter unit 30B includes an oscillator 116, a high current charge pump circuit block 112, and a regulator 118. The low current charge pump block 102 is coupled to an erase and program gate control unit 104, and the high current charge pump block 112 is coupled to a drain voltage control unit 114. As will be better understood by the description below, the charge pump blocks 102 and 112 generate the necessary power requirements for the flash memory circuit during programming and erase operations. During programming operations, a 12 volt gate voltage is provided on the selected word lines through control unit 104 while a 6 volt drain voltage is provided on the selected bit lines through control unit 114. During erase operations, 12 volts is provided on the sector source and all word lines are grounded. It is noted that the control units 104 and 114 are switching units that perform the functions of the program voltage switch 12 and the erase voltage switch 14 of FIG. 1. The control units 104 and 114 as well as oscillators 106 and 116 receive erase and program signals from the state control command register 10.

Figure 3:
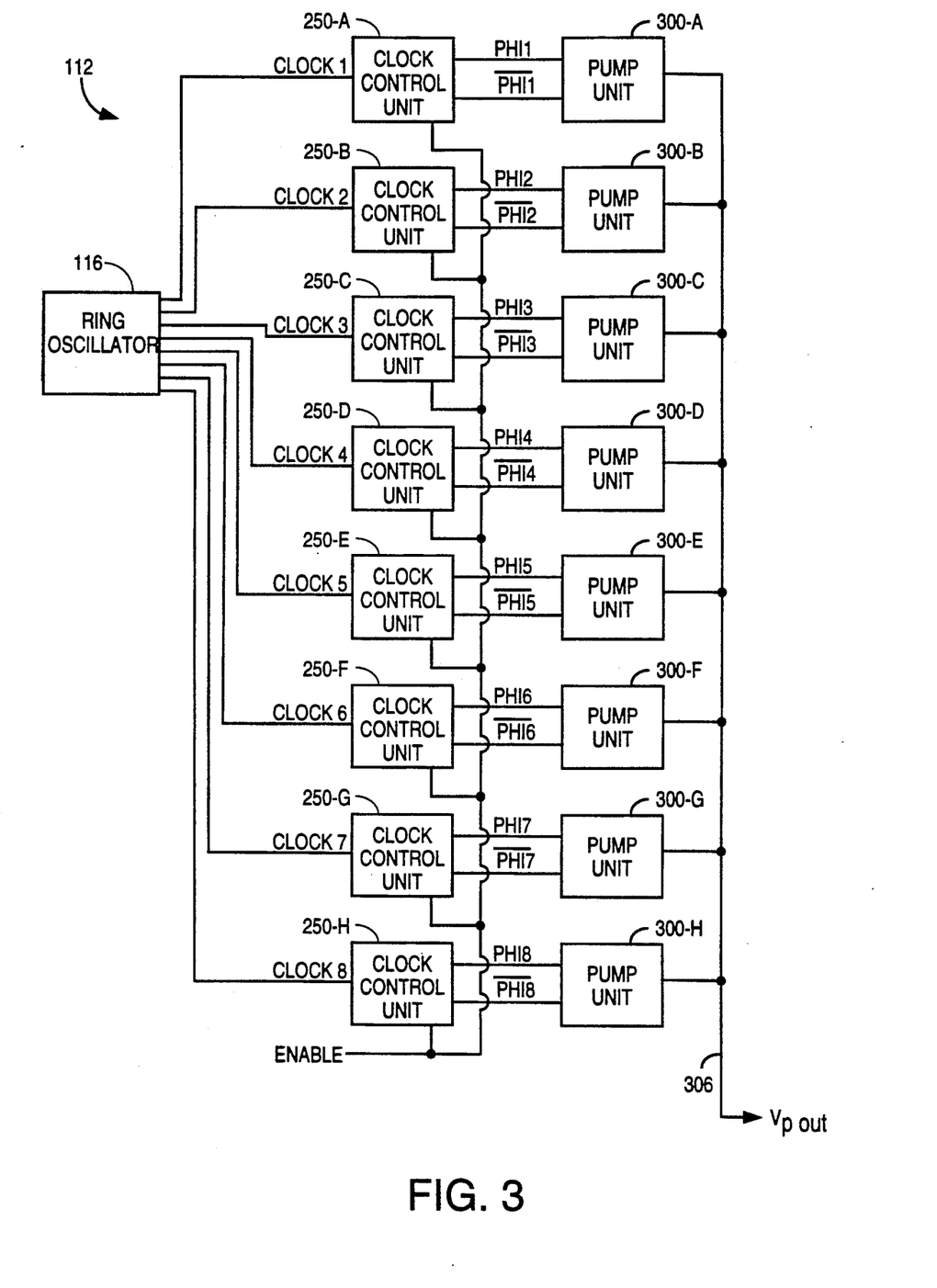
FIG. 3 is a block diagram of a high current charge pump circuit.

Referring next to FIG. 3, a block diagram is shown that illustrates the high current charge pump circuit 112 and the oscillator 116. In this embodiment, the oscillator 116 is configured as a ring oscillator. The high current charge pump circuit 112 includes eight clock control units 250-A through 250-H and eight voltage multiplier pump units 300-A through 300-H.

The high current charge pump circuit 112 is customized to generate the power necessary to drive the drain and source junctions of the memory cell transistors during program and erase operations. Connecting a plurality of conventional charge pump circuits in parallel to meet the power requirements is not acceptable due to increased noise generation.

During operation, the oscillator circuit 116 generates eight clock signals CLOCK1–CLOCK8 each having an equal frequency and an unequal phase. As shown, a separate clock signal is provided to each of the clock control units 250-A through 250-H. The clock control units 250-A through 250-H generate signals PHI1–PHI8 that drive the pump units 300-A through 300-H respectively. The pump units 300-A through 300-H are connected in parallel and are implemented using diode-capacitor voltage multipliers to thereby generate a high voltage at output line 306. The oscillator 116 and clock control units 250A–250H are configured such that the pump units 300-A through 300-H are always switched at different times with respect to one another. Thus, large voltage spikes do not result. This operation will be better understood with reference to the schematic and timing diagrams of FIGS. 2–6.

Figure 4:
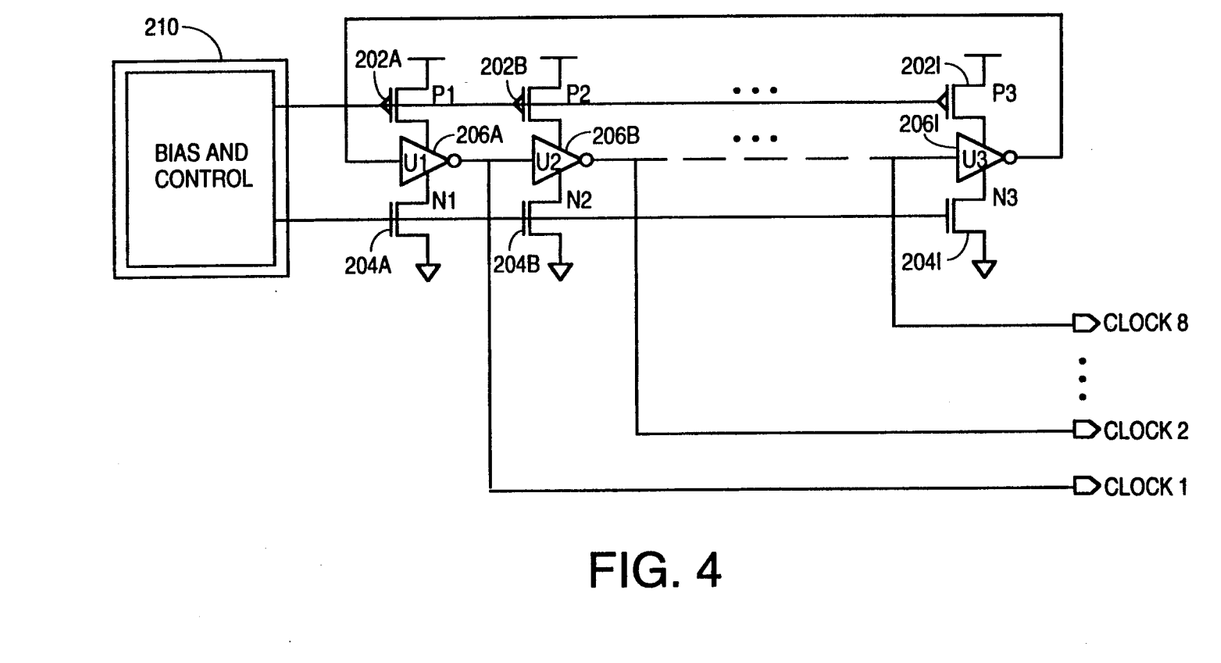
FIG. 4 is a schematic diagram illustrating an oscillator with stepped clock signals.

FIG. 4 is a schematic diagram that illustrates the ring oscillator circuit 116. The ring oscillator circuit includes nine P-channel field effect transistors 202-A through 202-I, nine N-channel field effect transistors 204-A through 204-I, and nine inverters 206-A through 206-I. The circuit further includes a bias and control unit 210.

Figures 5A, 5B:
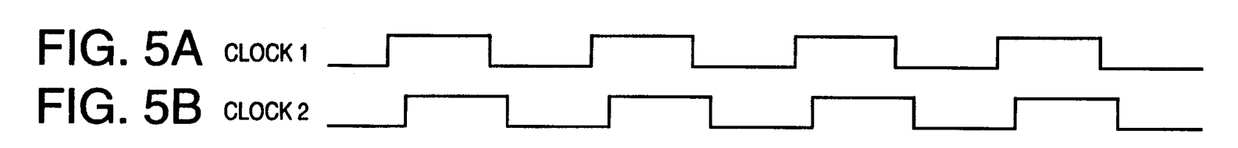
FIGS. 5A-5G are timing diagrams illustrating the stepped clock signals and the clock control unit signals used to drive the high current charge pump circuit.
Figure 5C:
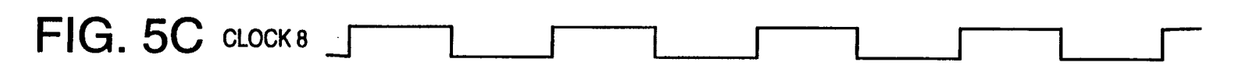
Figure 5D:
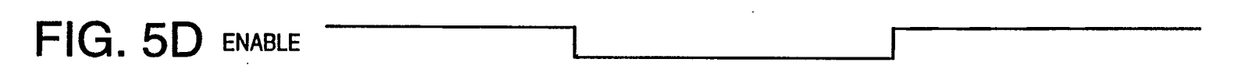
Figure 5E:
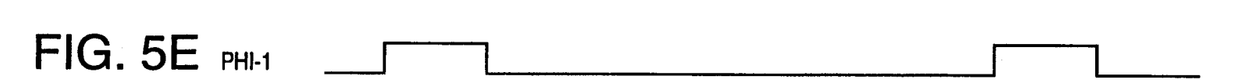
Figure 5F:
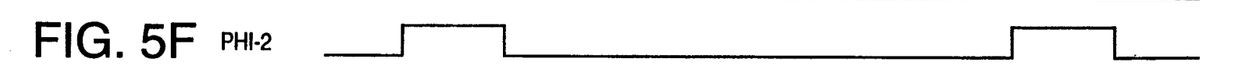
Figure 5G:
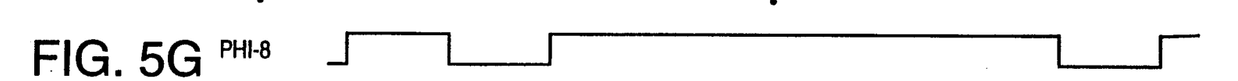

FIGS. 5A–5C are timing diagram illustrating the clock signals CLOCK1, CLOCK2 and CLOCK8 generated by ring oscillator circuit 116. It is noted that the bias and control unit 210 is designed such that the generated clock signals CLOCK1–CLOCK8 have a desired pump frequency and that each of the clock signals CLOCK1–CLOCK8 are delayed with respect to one another due to inverters 206-A through 206-I. As mentioned previously and as shown in FIG. 3, a separate clock signal CLOCK1–CLOCK8 is provided to each of clock control units 250-A through 250-H.

Figure 6:
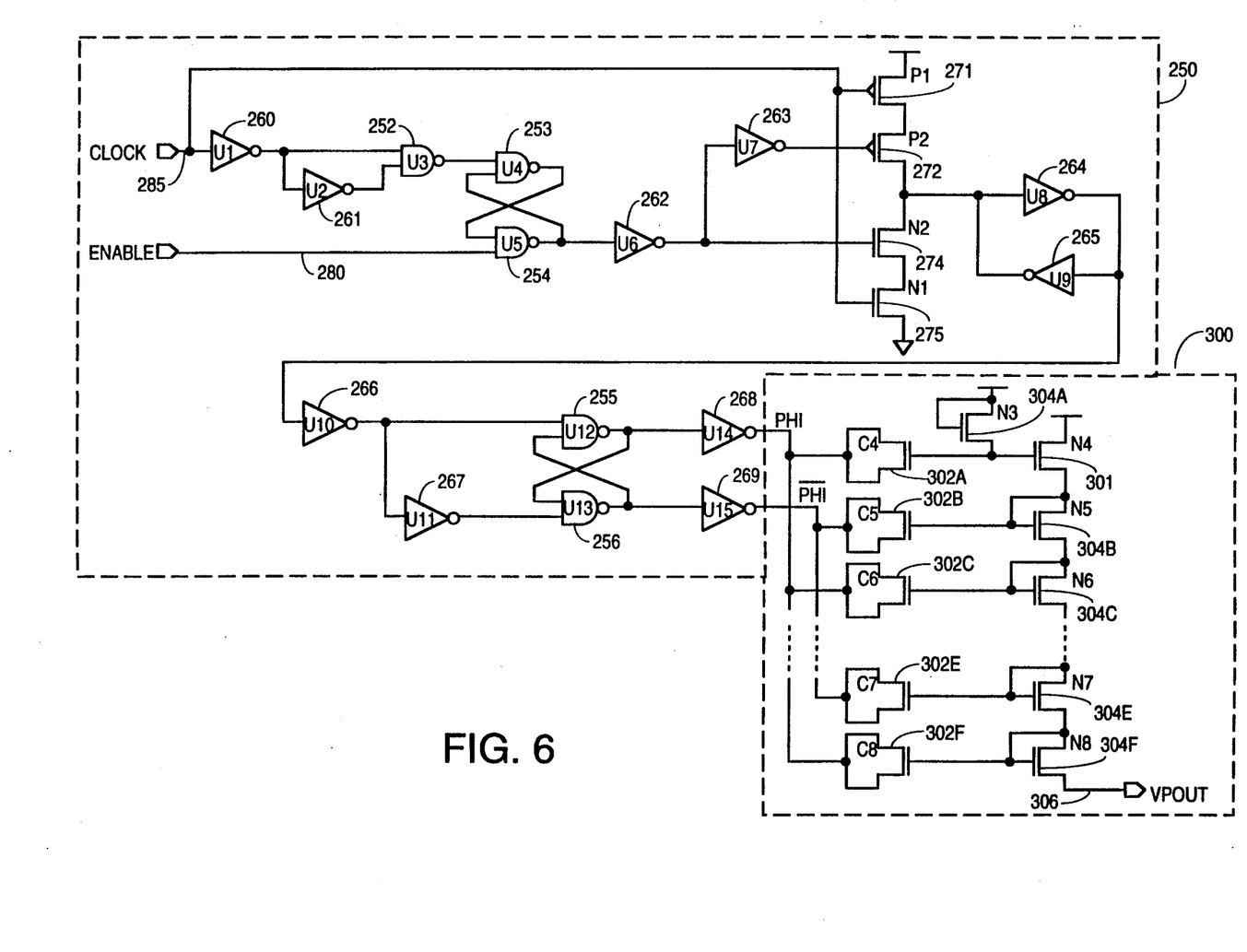
FIG. 6 is a schematic diagram illustrating a clock control unit and a pump unit.

Referring next to FIG. 6, a schematic diagram is shown that includes a clock control unit 250 and a pump unit 300. It is noted that clock control unit 250 is representative of each of the clock control units 250-A through 250-H of FIG. 3 and that pump unit 300 is representative of each of the pump units 300-A through 300-H of FIG. 3.

The clock control unit 250 includes NAND gates 252–256, inverters 260–269, P-channel field effect transistors 271 and 272, and N-channel field effect transistors 274 and 275. The clock control unit 250 is enabled by an enable signal at line 280, and receives one of the clock signals CLOCK1-CLOCK8 at line 285.

The clock control unit 250 is disabled when the enable signal at line 280 is low and is enabled when the enable signal is high. As illustrated in FIGS. 5D-5G, the output signal PHI (i.e., one of signals PHI1-PHI8) of the corresponding clock control unit 250 follows the state of the associated clock signal CLOCK1-CLOCK8 when the ENABLE signal is high. When the ENABLE signal goes low, the state of the signal PHI cannot change. When the ENABLE signal returns high, the state of the signal PHI does not change states until a corresponding change occurs in the associated clock signal.

It is noted that a latch circuit consisting of inverters 264 and 265 is used to store the state of the clock signal when the ENABLE signal goes low. As is evident from the circuit diagram, when the ENABLE signal goes low, transistors 272 and 274 are both turned off. Thus, during this time, a change in the state of the clock signal does not change the state of inverters 264 and 265. A flip-flop circuit consisting of NAND gates 253 and 254 is used to release the latch circuit (inverters 264, 265) when the clock signal goes low following reassertion of the ENABLE signal. The falling edge of the clock signal is detected by inverters 260 and 261 and NAND gate 252. Inverters 266-269 and a flip-flop circuitry consisting of NAND gates 255 and 256 prevent overlap in the PHI and $\overline{PHI}$ signals.

The pump unit 300 includes a plurality of N-channel field effect transistors 301, 302A-302F and 304A-304F. It is noted that transistors 302A-302F are connected as capacitors and that transistors 304A-304F are connected as diodes. The circuit thus forms a diode-capacitor voltage multiplier.

During operation of the pump unit 300, signals PHI and $\overline{PHI}$ generated by the corresponding clock control unit 250 alternately charge the capacitances established by transistors 302A-302F. The discharge of the voltage across the capacitances is prevented since current cannot flow in a reverse direction through the diodes established by transistors 304A-304F. Accordingly, the voltage at output line 306 increases as the capacitances of transistors 302A-302F are charged.

It is noted that the pump unit 300 utilizes field effect transistors to implement the diode-capacitor voltage multipliers since the circuit is incorporated on an integrated circuit. The pump unit 300 could alternatively be implemented using actual capacitors and diodes. It is also noted that the number of diode-capacitor stages controls the overall voltage level charged at output line 306. The number of diode-capacitor stages utilized could be varied without departing from the scope of the invention.

Referring back to FIG. 3, since the signals PHI1--PHI8 are out of phase with respect to one another, the pump units 300-A through 300-H are each switched on and off at different times. Consequently, minimal noise is generated at output line 306 in relation to the current capacity.

Although the circuit of FIG. 3 includes eight pump units 300-A through 300-H, the invention is equally applicable to circuits having a greater or lesser number of pump units connected in parallel. The number of pump units chosen for a particular application will depend upon the current requirements and the component values.

Referring back to FIG. 2, a 12 volt output signal is provided from the high current charge pump circuit 112 to the sector source junctions during erase operations. During program operations, the drain voltage control unit 114 converts the signal to 6 volts and provides an output signal to the cell bit line. During both program and erase operations, the high current charge pump circuit 112 is capable of providing the required current.

The low current charge pump circuit 102 provides a 6 volt output signal and can be configured as a standard charge pump. In one embodiment, the low current charge pump circuit 102 is implemented using a clock control circuit and pump unit as shown in FIG. 6.

As a result of the present invention, a memory device is provided that does not require an external high voltage supply for program and erase operations. Although the particular embodiment described is a flash memory, the invention may similarly be applied to EPROM devices.

Numerous modifications and variations will become apparent to those skilled in the art once the above-disclosure is fully appreciated. It is to be understood that the above detailed description of the preferred embodiment is intended to merely illustrative of the spirit and scope of the invention and should not be taken in a limiting sense. The scope of the claimed invention is better defined with reference to the following claims.

We claim:

1. A memory device comprising:
   a memory cell matrix including a plurality of memory locations;
   an input power supply terminal for providing power to said memory device;
   an erase decoder coupled to said memory cell matrix for erasing selected ones of said plurality of memory locations; and
   a charge pump circuit coupled to said input power supply terminal and to said erase decoder for converting a voltage signal provided at said input power supply terminal to a higher voltage signal and for providing said higher voltage signal to said memory cell matrix;
   wherein said charge pump circuit comprises:
   a voltage output line;
   a first voltage pump unit including at least a first capacitive element coupled to said voltage output line wherein said first capacitive element is charged in response to a first clocking signal; and
   a second voltage pump unit including at least a second capacitive element coupled to said voltage output line, wherein said second capacitive element is charged in response to a second clocking signal having an unequal phase relative to said first clocking signal.

2. The memory device as recited in claim 1 wherein said first voltage pump unit further includes a first diode element coupled to said first capacitive element and wherein said second voltage pump unit further includes a second diode element coupled to said second capacitive element.

3. The memory device as recited in claim 1 wherein said first capacitive element and said second capacitive element are implemented with field-effect-transistors.

4. The memory device as recited in claim 1 further comprising an input/output buffer circuit coupled to said memory cell matrix.

5. The memory device as recited in claim 1 further comprising a program decoder coupled to said memory cell matrix for programming selected ones of said plurality of memory locations.

6. A memory device comprising:
a memory cell matrix including a plurality of memory locations;
an input power supply terminal for providing power to said memory device;
an erase decoder coupled to said memory cell matrix for erasing selected ones of said plurality of memory locations; and
a charge pump circuit coupled to said input power supply terminal and to said erase decoder for converting a voltage signal provided at said input power supply terminal to a higher voltage signal and for providing said higher voltage signal to said memory cell matrix;
wherein said charge pump circuit comprises:
a ring oscillator circuit for providing a plurality of clocking signals, each of said clocking signals having an unequal phase with respect to the others;
a plurality of clock control units each coupled to receive a separate clocking signal from said ring oscillator circuit and for generating a corresponding pump control signal;
a plurality of voltage pump units each coupled to a separate one of said plurality of clock control units and including means for generating a voltage output signal in response to said corresponding pump control signal; and
a voltage output line coupled to each of said plurality of voltage pump units.

7. The memory device as recited in claim 6 wherein each of said plurality of voltage pump units includes a diode-capacitor voltage multiplier.

8. The memory device as recited in claim 6 further including an enable input line for providing a signal for disabling said charge pump circuit.

9. The memory device as recited in claim 6 wherein each of said clock control units further comprises a means to prevent a change in the state of said corresponding pump control signal when the separate clocking signal does not change states.

10. The memory device as recited in claim 9 wherein each of said clock control units further comprises a latch circuit to store a state of the separate clocking signal when an enable signal provided to said enable input line goes low.

11. The memory device as recited in claim 10 wherein said means to prevent a change in the state of said corresponding pump control signal includes a flip-flop circuit to release said latch circuit when the separate clocking signal goes low.

12. The memory device as recited in claim 11 wherein each of said clock control units further comprises an edge detector circuit coupled to said flip-flop circuit for detecting a change of state of said separate clocking signal.

13. A memory device comprising:
a memory cell matrix including a plurality of memory locations;
an input power supply terminal for providing power to said memory device;
a programming decoder coupled to said memory cell matrix for programming selected ones of said plurality of memory locations; and
a charge pump circuit coupled to said input power supply terminal and to said programming decoder for converting a voltage signal provided at said input power supply terminal to a higher voltage signal and for providing said higher voltage signal to said memory cell matrix wherein an electrical current required for programming selected ones of said plurality of memory locations is provided by said higher voltage signal
wherein said charge pump circuit comprises:
a voltage output line;
a first voltage pump unit including at least a first capacitive element coupled to said voltage output line wherein said first capacitive element is charged in response to a first clocking signal; and
a second voltage pump unit including at least a second capacitive element coupled to said voltage output line, wherein said second capacitive element is charged in response to a second clocking signal having an unequal phase relative to said first clocking signal.

14. The memory device as recited in claim 13 wherein said first voltage pump unit further includes a first diode element coupled to said first capacitive element and wherein said second voltage pump unit further includes a second diode element coupled to said second capacitive element.

15. The memory device as recited in claim 13 wherein said first capacitive element and said second capacitive element are implemented with field-effect-transistors.

16. The memory device as recited in claim 13 further comprising an input/output buffer circuit coupled to said memory cell matrix.

17. A memory device comprising:
a memory cell matrix including a plurality of memory locations;
an input power supply terminal for providing power to said memory device;
a programming decoder coupled to said memory cell matrix for programming selected ones of said plurality of memory locations; and
a charge pump circuit coupled to said input power supply terminal and to said programming decoder for converting a voltage signal provided at said input power supply terminal to a higher voltage signal and for providing said higher voltage signal to said memory cell matrix wherein an electrical current required for programming selected ones of said plurality of memory locations is provided by said higher voltage signal;
wherein said charge pump circuit comprises:
a ring oscillator circuit for providing a plurality of clocking signals, each of said clocking signals having an unequal phase with respect to the others;
a plurality of clock control units each coupled to receive a separate clocking signal from said ring oscillator circuit and for generating a corresponding pump control signal;
a plurality of voltage pump units each coupled to a separate one of said plurality of clock control units and including means for generating a voltage output signal in response to said corresponding pump control signal; and
a voltage output line coupled to each of said plurality of voltage pump units.

18. The memory device as recited in claim 17 wherein each of said plurality of voltage pump units includes a diode-capacitor voltage multiplier.

19. The memory device as recited in claim 17 further including an enable input line for providing a signal for disabling said charge pump circuit.

20. The memory device as recited in claim 17 wherein each of said clock control units further comprises a means to prevent a change in the state of said corresponding pump control signal when the separate clocking signal does not change states.

21. The memory device as recited in claim 20 wherein each of said clock control units further comprises a latch circuit to store a state of the separate clocking signal when an enable signal provided to said enable input line goes low.

22. The memory device as recited in claim 21 wherein said means to prevent a change in the state of said corresponding pump control signal includes a flip-flop circuit to release said latch circuit when the separate clocking signal goes low.

23. The memory device as recited in claim 22 wherein each of said clock control units further comprises an edge detector circuit coupled to said flip-flop circuit for detecting a change of state of said separate clocking signal.

24. A memory device comprising:

a memory cell matrix including a plurality of memory transistors each having a gate terminal, a drain terminal, and a source terminal;

an input power supply terminal for providing power to said memory device;

an erase decoder coupled to said memory cell matrix for erasing selected ones of said plurality of memory transistors, and a charge pump circuit, coupled to said input power supply terminal and to said erase decoder, and including a ring oscillator for generating a plurality of clocking signals, each of said plurality of clocking signals differing in phase from all others of said plurality of clocking signals, said charge pump circuit further including a plurality of clock control circuits, each of said plurality of clock control circuits generating an output signal in response to one of said plurality of clocking signals, said charge pump circuit further including a plurality of voltage pump units, each of said plurality of voltage pump units connected to receive said output signal generated by one of said plurality of clock control circuits, said plurality of voltage pump units generating a voltage output signal on a common voltage output line.

* * * * *